(12) United States Patent
Zheng et al.

(10) Patent No.: US 6,396,569 B2
(45) Date of Patent: May 28, 2002

(54) IMAGE DISPLACEMENT TEST RETICLE FOR MEASURING ABERRATION CHARACTERISTICS OF PROJECTION OPTICS

(75) Inventors: Sandra S. Zheng, Plano; Cindy Pan, Allen, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/772,516

(22) Filed: Jan. 29, 2001

Related U.S. Application Data

(63) Continuation-in-part of application No. 09/389,007, filed on Sep. 2, 1999.

(51) Int. Cl.[7] ........................ G03B 27/32; G03B 27/42; G03B 27/52; G03C 5/00
(52) U.S. Cl. .............................. 355/77; 355/53; 355/55; 430/30
(58) Field of Search .............................. 355/53, 55, 77; 430/30

(56) References Cited

U.S. PATENT DOCUMENTS

| | | | |
|---|---|---|---|
| 4,862,008 A | | 8/1989 | Oshida et al. |
| 5,004,348 A | * | 4/1991 | Magome ..................... 356/401 |
| 5,276,337 A | | 1/1994 | Starikov |
| 5,684,569 A | * | 11/1997 | Sugaya et al. ................ 355/71 |
| 5,811,511 A | | 9/1998 | Tanigawa et al. |

* cited by examiner

Primary Examiner—Russell Adams
Assistant Examiner—Khaled Brown
(74) Attorney, Agent, or Firm—April M. Mosby; W. James Brady; Frederick J. Telecky, Jr.

(57) ABSTRACT

A method for testing the image displacement of a reticle following a change in illumination comprising the steps of taking a first image displacement measurement with a test reticle (110) having a variable linewidth (L) and a variable pitch size (s) on an image displacement mark (30, 40, 50, 60, 70, 80, 90, 100), changing the illumination conditions of the photolithographic equipment and taking a second image displacement measurement with the test reticle (110) to determine an image displacement offset due to changes in illumination, is disclosed.

32 Claims, 12 Drawing Sheets

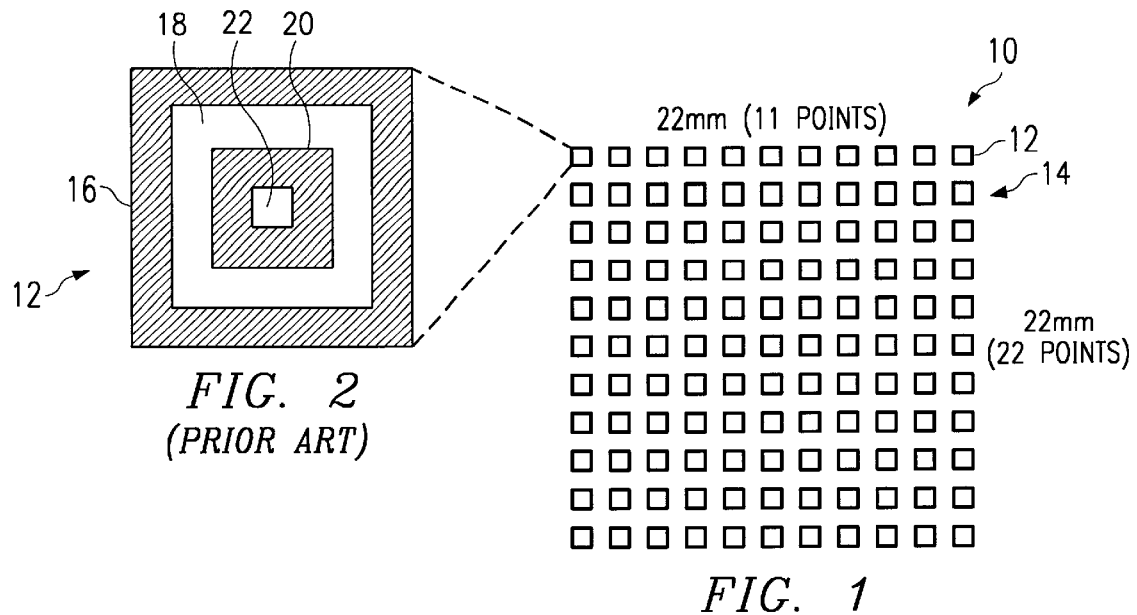
FIG. 2 (PRIOR ART)
FIG. 1
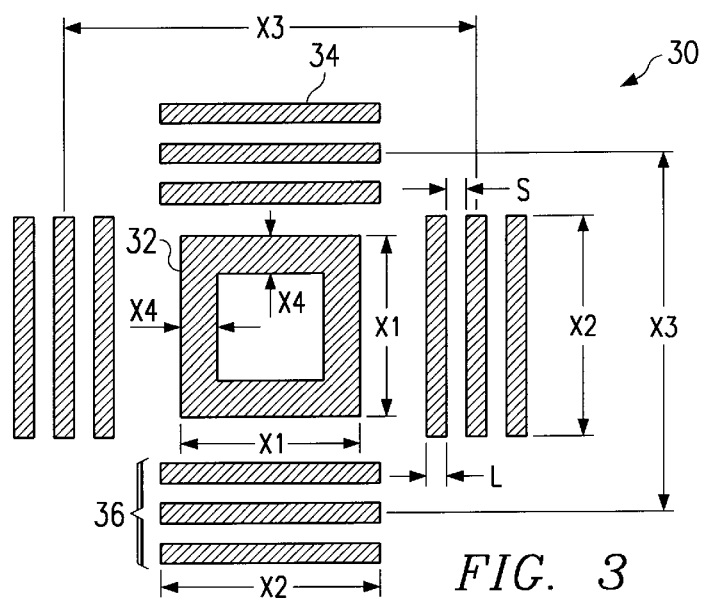
FIG. 3

IMAGE DISPLACEMENT TEST RETICLE FOR MEASURING ABERRATION CHARACTERISTICS OF PROJECTION OPTICS

This application is a continuation-in-part of application Ser. No. 09/389,007, filed Sep. 2, 1999.

TECHNICAL FIELD OF THE INVENTION

The present invention relates in general to the field of semiconductor silicon wafer image displacement, and more particularly, to a photolithography reticle pattern for use in measuring image displacement and coma aberration of projection optics.

BACKGROUND OF THE INVENTION

Without limiting the scope of the invention, its background is described in connection with image displacement in semiconductor silicon wafer reticle alignment, as an example.

Heretofore, in this field, alignment marks have been used to position masks for subsequent steps in the processing of semiconductor devices. During the performance of failure analysis, reticle levels and their revisions are generally checked on the semiconductor material. Presently, techniques such as staining in conjunction with scanning electron microscopy and transmission electron microscopy have been used to check the alignment of photolithographic masks after a step that patterns a photoresist. Elemental techniques, such as Auger and secondary ion mass spectroscopy have likewise been used for analyzing semiconductor devices.

Although these techniques are all useful for device failure analysis, it has been found that they provide inconclusive data when used to test for the alignment characteristics of photolithography lenses, such as image displacement and coma aberration and the like. Coma aberration of projection optics in photolithographic patterning systems degrades a resist profile symmetricity and enhance placement error which depends upon pattern size, density and feature.

Several approaches exist which estimate coma aberration of projection optics. Since coma aberration appears in the line-width asymmetry at both ends of several periodic lines, the differences in line-width between both ends are usually measured to characterize the coma aberration. It is, however, difficult to make the mask for this method because both ends of the periodic lines must be the same width as the other. Coma aberration also appears in asymmetric secondary peaks around a contact hole exposed with an attenuated mask. Therefore, the direction of comma aberration is found from the ghost pattern around the contact hole. Furthermore, coma aberration makes relative pattern shifts depending on pattern size and density. This method of measuring the differences in line width between both ends, however, takes a long time for measurement because of the time consuming procedure of using, for example, exposure, Si-etching, exposure with alignment, and measurement using CD-SEM.

Thus, these techniques are time consuming and are ill-suited for use in identifying and characterizing lens and photolithographic misalignment and failure.

In particular, it has been found that present overlay methods will fail to provide accurate information for the critical dimensions used, especially for the future generations of semiconductor devices.

Present image displacement marks are unable to detect image displacement of the projection lense system within the range of present semiconductor device linewidths and pitch sizes, causing large yield drops during semiconductor fabrication.

SUMMARY OF THE INVENTION

What is needed, therefore, is a apparatus and method for determining image displacement accuracy following a change in reticle and illumination that is capable of being used with existing stepper optical systems. Also needed is an apparatus and method of rapidly testing optical equipment for proper image displacement performance impacted by image displacement caused by coma aberration at the level of resolution necessary to provide accurate critical dimension readings for very large scale integration (VLSI) and ultra large scale integration (ULSI) devices.

The image displacement test reticle of the present invention may be used to fully characterize the performance of the stepper optical image as well as projection system. More specifically, the image displacement test reticle may be used to solve the displacement discrepancy problems between the current standard image displacement mark and array cells inside the chip, thereby increasing device yield during production.

A reticle, as used herein, is used to describe a photolithographic mask having a test pattern for photolithographic machine evaluation, specifically, coma aberration of projection optics. The test reticle is used for making a mask or reticle alignment and making adjustments to production masks. Mask, on the other hand, is used herein to delineate a production mask used during patterning steps for producing microcircuits.

More particularly, one embodiment of the present invention is directed to a method of measuring coma aberration of the projection optics following a change in illumination including the steps of, taking a first image displacement measurement with a test reticle having a variable linewidth and a variable pitch size on an outer image displacement mark, changing the illumination conditions of photolithographic equipment, such that a variable beam of illumination is projected upon the test reticle and taking a second image displacement measurement with the test reticle to determine an image displacement offset due to changes in illumination.

The present invention may further include changing the illumination conditions of photolithographic equipment projected upon the test reticle and taking a third image displacement measurement. The third measurement may be compared to the first or second image displacement measurement to determine an image displacement offset due to a further change in illumination, such as a different type of illumination than in the first change in illumination. Also, the invention may use a test reticle that further includes an inner box located within the outer image displacement mark. Based on the image displacement offset measured with the test reticle, the image displacement of a reticle, e.g., a production reticle, may be changed during subsequent steps, e.g., printing steps, that involve a change in type of illumination.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 1 is an image displacement pattern array of an image displacement test reticle;

FIG. 2 is an image displacement test pattern of the prior art;

FIGS. 3–10 are image displacement marks for use with an image displacement test reticle as disclosed herein;

DETAILED DESCRIPTION OF THE INVENTION

Figure 4:
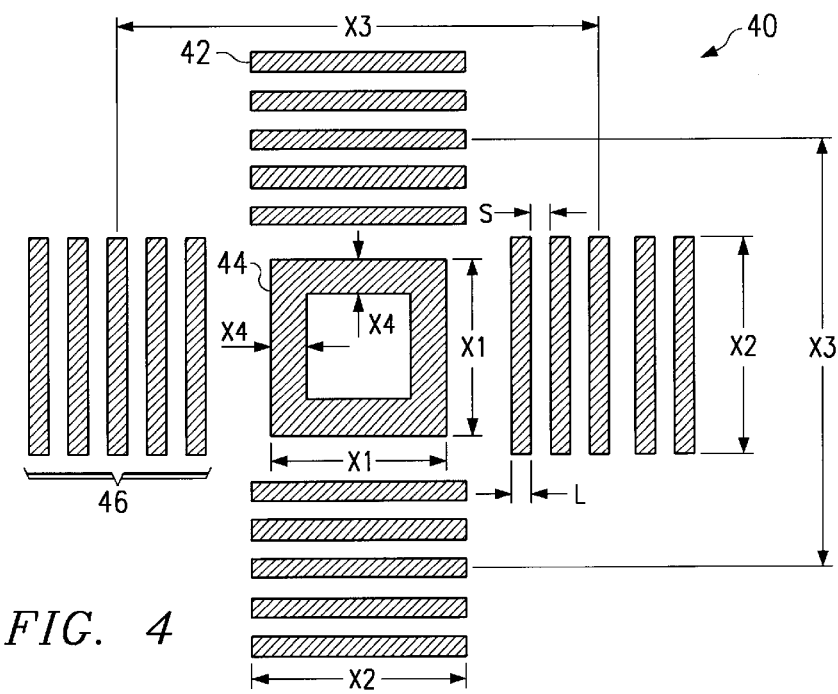

While the making and using of various embodiments of the present invention are discussed in detail below, it should be appreciated that the present invention provides many applicable inventive concepts which may be embodied in a wide variety of specific contexts. The specific embodiments discussed herein are merely illustrative of specific ways to make and use the invention and do not delimit the scope of the invention.

As the critical dimension (CD) of very large scale integration (VLSI) circuits is pushed to the stepper resolution limit, phase shift masks (PSM), optical proximity correction (OPC), modified illumination and pupil filtering technologies have been introduced to enhance the performance of photolithography systems for printing finer patterns. In practical use, modified illumination, in conjunction with various illumination apertures, such as quadrupole, annular and small sigma, may improve the resolution limits and depth of focus (DOF) for specified device levels. The degradation of image displacement accuracy with the change of illumination aperture, however, remains a critical issue when applying modified illumination method to smaller linewidth and pitch size patterns of higher integration semiconductor devices. The difficulties of controlling overlay accuracy, especially on a 64-megabyte device, remains a problem.

Two issues must be addressed in order to improve photolithographic printing of VLSI circuits: (1) illumination mismatching between two layers, such as using conventional illumination with small sigma for first critical level prints and quadrupole illumination for second critical level prints; and (2) the standard 10–20 m box-in box image displacement mark has different misalignment results as compared with the misalignment results of the smaller feature size inside the chip of an actual device.

It has now been recognized that the displacement of the standard box-in-box overlay pattern is not sensitive enough to identify the displacement caused when switching illumination conditions, in particular, as smaller feature patterns inside the chip are required. For example, while the measurement from a standard overlay mark achieves a good initial image displacement result, it does not ensure that printing a pattern on the actual chip achieves the same result. The problem with current box-in-box patterns for line/space patterns is further increased because the actual device characteristics can only be measured by CD metrology tool SEM, which is very labor intensive and time consuming. Furthermore, current analysis methods can include process related errors, stepper alignment system errors and overlay metrology measurement errors.

In order to fully understand the stepper intrafield overlay displacement under different illumination modes, an image displacement test reticle has been designed as an overlay test reticle to determine the aberration characteristics and performance of the projection lens. The image displacement test reticle of the present invention has one and two layer image displacement patterns with 11 by 11 sites within the field. Image displacement pattern linewidths range from 0.22 $\mu$m to 1 $\mu$m. One layer image displacement patterns, using 2 $\mu$m linewidth inner box as a measurement reference and three bars having different linewidth and pitch sizes as an outer box structure, can be used to test the image displacement for various linewidths and pitch sizes. By printing a one layer pattern as a first print, image displacement readings were automatically measured using, e.g., a KLA™-type metrology tool. The test method disclosed herein also minimizes process related errors and eliminates stepper image displacement system errors.

The image displacement test reticle variations disclosed herein were used to identify the image displacement with four modified illumination conditions. The image displacement of 0.3 $\mu$m, 0.4 $\mu$m, 0.6 $\mu$m, 1.0 $\mu$m equal line/space outer bars, 0.5 $\mu$m isolated line outer bar and, e.g., a standard KLA™ mark are described hereinbelow.

The exposure tool used with the image displacement test reticle is an I-line stepper (Canon, U.S.A.). The image displacement test reticle disclosed herein was used to print one layer image displacement structures with 0.3 $\mu$m, 0.4 $\mu$m, 0.6 $\mu$m, 1.0 $\mu$m equal line/space outer bar image displacement marks and 0.5 $\mu$m isolated line outer bar image displacement mark, as well as a standard KLA™ mark. Four illumination modes were used, which were convention illumination numerical aperture (NA) NA=0.63, =0.65 and NA=0.63, =0.3, quadrupole and annular. After printing and developing the image displacement test marks on the double polish bare silicon wafers coated by 1.0 $\mu$m PFI34 resist, the data was measured using a KLA™ 5200 metrology tool.

In FIG. 1, an image displacement pattern array 10 of the prior art is depicted and is shown herein as a blow-up from its standard side length of 22 millimeters. Image displacement test pattern 12, eleven patterns to a side, form square array of patterns 12, and are separated by gap 14 between patterns 12. A blowup of one of these patterns 12 is depicted having a line 16 and a pitch 18. The line 16 and the pitch 18 have a design of the prior art, and form a box-in-box pattern having an outer box 20 and an inner box 22. The critical dimensions (CD) of the box-in-box pattern is a one to two micrometer linewidth for line 16, and 10 to 20 micrometers for the pitch size for the pitch 18. A box-in-box pattern 12 of the prior art is depicted in FIG. 2.

Turning now to the present invention, an image displacement mark 30 is depicted in FIG. 3. The image displacement mark 30 includes four sets of lines 34 that surround a box 32, which replace the image displacement pattern 12 of FIG. 1. The lines 34 form a triad 36. Four of these triads 36 surround, and are centered around, box 32. Each of the lines 34 that form triad 36 have a constant linewidth L and are separated by a constant pitch size S. The length of the lines 34 is the distance X2. A distance X3 is used to describe the distance between triad 36 at opposite ends of box 32. The box 32 has an outer length dimension X1, and the thickness of the line that makes up the box 32 is measured as X4. In one embodiment of the present invention, the distance X1 may be about 10 micrometers, the distance X2 may be about 14 micrometers, the distance X3 may be about 25 micrometers and the distance X4 is about 2 micrometers. The line 34 has a length L and a pitch size S between lines 34 that may vary depending the critical dimensions required for aligning the test pattern 30, as described hereinbelow. The linewidth and pitch size variables L and S are described in Table 1, herein below. The linewidth and pitch sizes will vary on the device size of the underlying circuit, with smaller sizes for smaller device widths.

sions L and S are described in Table 2 hereinbelow. The linewidth and pitch sizes will vary on the device size of the underlying circuit, with smaller sizes for smaller device widths.

TABLE 2 unit: um

| L | S | L | S | L | S | L | S | L | S |
|---|---|---|---|---|---|---|---|---|---|
| 1 | 1 | 0.9 | 0.9 | 0.8 | 0.8 | 0.7 | 0.7 | 0.6 | 0.6 |
| 0.5 | 0.5 | 0.5 | 1 | 0.5 | 1.5 | 0.5 | 2 | 0.5 | 2.5 |
| 0.4 | 0.4 | 0.4 | 0.8 | 0.4 | 1.2 | 0.4 | 1.6 | 0.4 | 2 |
| 0.35 | 0.35 | 0.35 | 0.7 | 0.35 | 1.05 | 0.35 | 1.4 | 0.35 | 1.75 |
| 0.32 | 0.32 | 0.32 | 0.64 | 0.32 | 0.96 | 0.32 | 1.28 | 0.32 | 1.6 |
| 0.3 | 0.3 | 0.3 | 0.6 | 0.3 | 0.9 | 0.3 | 1.2 | 0.3 | 1.5 |
| 0.28 | 0.28 | 0.28 | 0.56 | 0.28 | 0.84 | 0.28 | 1.12 | 0.28 | 1.4 |
| 0.25 | 0.25 | 0.25 | 0.5 | 0.25 | 0.75 | 0.25 | 1 | 0.25 | 1.25 |
| 0.22 | 0.22 | 0.22 | 0.44 | 0.22 | 0.66 | 0.22 | 0.88 | 0.22 | 1.1 |

Figure 5:
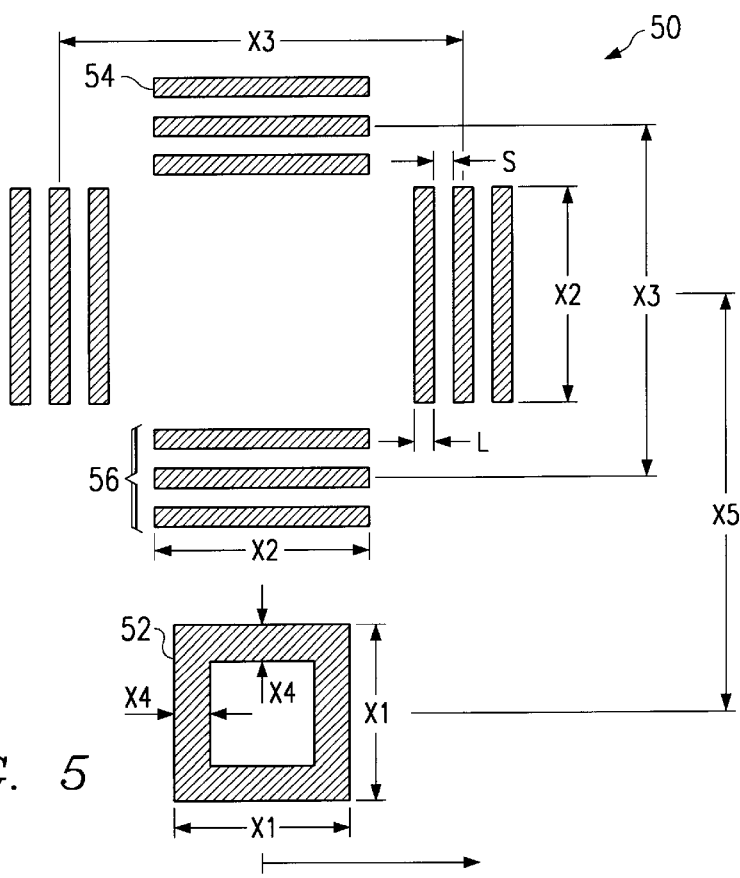

Turning now to FIG. 5, an image displacement mark 50 is depicted in which the box 52 is not positioned within the lines 54 which form triads 56. In image displacement mark 50, the box 52 is located adjacent to the four sets of triad 56. The distance between the center point of the triads 56 and the box 52 is X5. As with the previous figures, the line 54

TABLE 1 unit: um

| L | S | L | S | L | S | L | S | L | S | L | S |
|---|---|---|---|---|---|---|---|---|---|---|---|
| 1 | 1 | 0.9 | 0.9 | 0.8 | 0.8 | 0.7 | 0.7 | 0.6 | 0.6 | 0.38 | 0.38 |
| 0.5 | 0.5 | 0.5 | 1 | 0.5 | 1.5 | 0.5 | 2 | 0.5 | 2.5 | single 0.5 | line = |
| 0.4 | 0.4 | 0.4 | 0.8 | 0.4 | 1.2 | 0.4 | 1.6 | 0.4 | 2 | single 0.4 | line = |
| 0.35 | 0.35 | 0.35 | 0.7 | 0.35 | 1.05 | 0.35 | 1.4 | 0.35 | 1.75 | single 0.35 | line = |
| 0.32 | 0.32 | 0.32 | 0.64 | 0.32 | 0.96 | 0.32 | 1.28 | 0.32 | 1.6 | single 0.32 | line = |
| 0.3 | 0.3 | 0.3 | 0.6 | 0.3 | 0.9 | 0.3 | 1.2 | 0.3 | 1.5 | single 0.3 | line = |
| 0.28 | 0.28 | 0.28 | 0.56 | 0.28 | 0.84 | 0.28 | 1.12 | 0.28 | 1.4 | single 0.28 | line = |
| 0.25 | 0.25 | 0.25 | 0.5 | 0.25 | 0.75 | 0.25 | 1 | 0.25 | 1.25 | single 0.25 | line = |
| 0.22 | 0.22 | 0.22 | 0.44 | 0.22 | 0.66 | 0.22 | 0.88 | 0.22 | 1.1 | single 0.22 | line = |

Table 1 contains the variable dimensions for the linewidth L and D pitch size S for image displacement mark 30 and image displacement mark 50 described hereinbelow at FIG. 5.

FIG. 4 describes an image displacement marked 40 in which five variable lines 42 are arranged in parallel to form a pentad 46 that surrounds a box 44. As with the image displacement mark 30 described in FIG. 3, the image displacement mark 40 described in FIG. 4 is defined by the following parameters. The lines 42 has a linewidth L. The lines 42 are separated by a pitch size S. The lines 42 have a length X2. The distance between the center points of pentads 46 and opposite ends of box 44 is defined as X3. Box 44 has an outer dimension of X1 and has a box linewidth defined by X4. For image displacement mark 40 the distance X1 is about 10 micrometers, the distance X2 is about 14 micrometers, the distance X3 is about 31 micrometers, and the distance X4 is about 2 micrometers. The variable dimenhas a linewidth and pitch size that are variable too. The length of line 54 is defined by X2 and the distance between triad 56 center points is the distance X3. The box 52 has an outer length X1 and a line size X4. The dimension of the triple variable line and space with box pattern depicted herein as image displacement box 50 are as follows: X1 is about 10 micrometers, X2 is about 14 micrometers, X3 is about 25 micrometers, X4 is about 2 micrometers, and X5 is about 50 micrometers. The variable dimensions for the linewidth L and the pitch size S are variable and are described hereinabove in Table 1.

Figure 6:
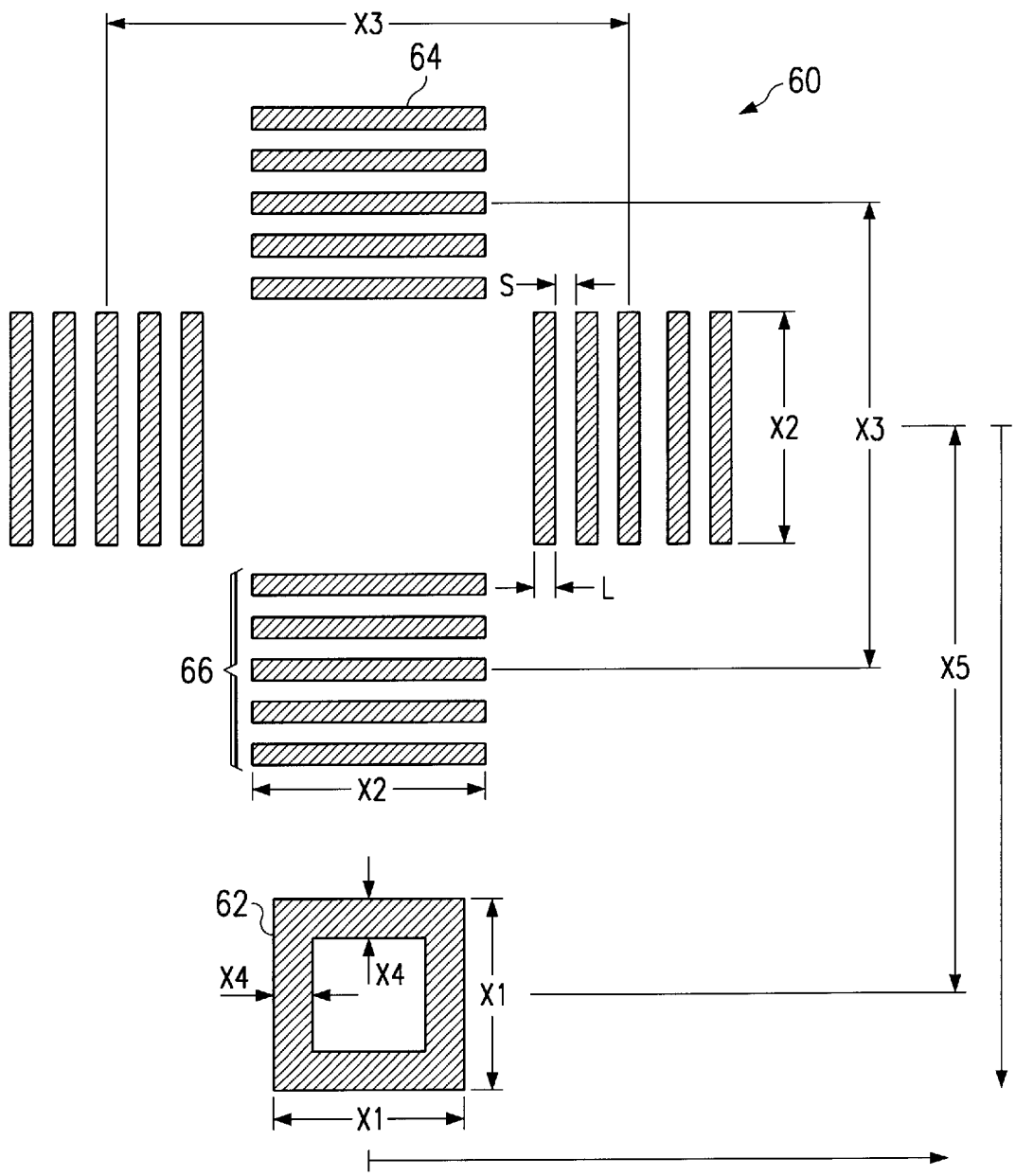

FIG. 6 is image displacement mark 60 that is depicted in which a pentad 66 of lines 64 area arranged in an empty box configuration adjacent a box 62. The distance between the center point of the pentads 66 and the box 62 is X5. As with the previous figures, the line 64 has a linewidth and pitch size that are variable too. The length of line 64 is defined by X2 and the distance between pentad 66 center points is the distance X3. The box 62 has an outer length X1 and a line size X4. The dimension of the pentad variable line and space with box pattern depicted herein as image displacement box 60 are as follows: X1 is about 10 micrometers, X2 is about 14 micrometers, X3 is about 25 micrometers, X4 is about 2 micrometers, and X5 is about 50 micrometers. The variable dimensions for the linewidth L and the pitch size S are variable and are described hereinabove in Table 1.

Figure 7:
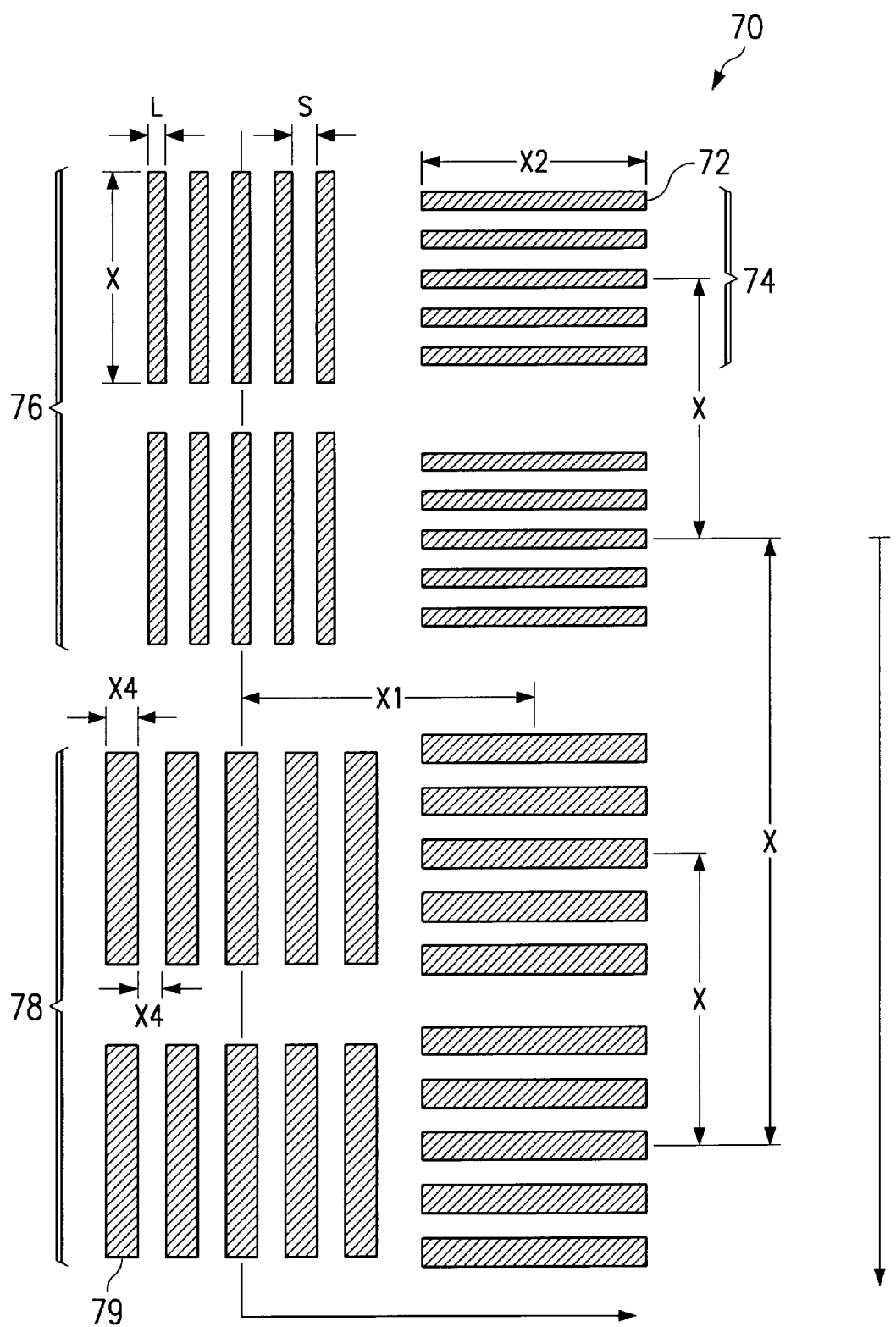

FIG. 7 shows another image displacement mark 70 having lines 72 that form eight pentads 74. The distance between pentads 74 is measured by the distance X, which is also the length of lines 72. The linewidth of line 72 is measured by L and the pitch size or distance between the line 72 is measured by the distance S. The image displacement mark 70 is divided into a small array 76 of pentads in a large array of pentad 78. The line 79 of the larger array pentad 78 have a width of X4 and a matching distance of pitch size distance of X4 as well. The dimensions for X1 may be about 25 micrometers, X2 about 10 micrometers, having the distance of L may be about 2 micrometers, and S about 2 micrometers. The variation is obtained by varying the numbers L and S described hereinbelow in Table 3. The linewidth and pitch sizes will vary on the device size of the underlying circuit, with smaller sizes for smaller device widths.

Conversely, the linewidth and the pitch size are defined by dividing the different lines 82 from the ends as they approach the middle of the image displacement mark 80 by dividing the variable L2 by S2 as they approach the center in mark 83 from right to left. The non-variable numbers are L1 and S1 have a dimension of about one micrometer. The variation is obtained by varying the numbers L2 and S2 described hereinbelow in Table 4. The linewidth and pitch sizes will vary on the device size of the underlying circuit, with smaller sizes for smaller device widths.

TABLE 4

| L2/S2 array size (unit: um) | |
|---|---|
| L2 | S2 |
| 0.5 | 0.5 |
| 0.4 | 0.4 |
| 0.35 | 0.35 |
| 0.32 | 0.32 |
| 0.3 | 0.3 |
| 0.27 | 0.27 |
| 0.25 | 0.25 |
| 0.22 | 0.22 |
| 0.2 | 0.2 |

TABLE 3 unit: um

| L | S | L | S | L | S | L | S | L | S | L | S |
|---|---|---|---|---|---|---|---|---|---|---|---|
| 0.5 | 0.5 | 0.5 | 1 | 0.5 | 1.5 | 0.5 | 2 | 0.5 | 2.5 | single 0.5 | line = |
| 0.4 | 0.4 | 0.4 | 0.8 | 0.4 | 1.2 | 0.4 | 1.6 | 0.4 | 2 | single 0.4 | line = |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.35 | 0.35 | 0.35 | 0.7 | 0.35 | 1.05 | 0.35 | 1.4 | 0.35 | 1.75 | single 0.35 | line = |
| 0.32 | 0.32 | 0.32 | 0.64 | 0.32 | 0.96 | 0.32 | 1.28 | 0.32 | 1.6 | single 0.32 | line = |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.3 | 0.3 | 0.3 | 0.6 | 0.3 | 0.9 | 0.3 | 1.2 | 0.3 | 1.5 | single 0.3 | line = |
| 0.28 | 0.28 | 0.28 | 0.56 | 0.28 | 0.84 | 0.28 | 1.12 | 0.28 | 1.4 | single 0.28 | line = |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.25 | 0.25 | 0.25 | 0.5 | 0.25 | 0.75 | 0.25 | 1 | 0.25 | 1.25 | single 0.25 | line = |
| 0.22 | 0.22 | 0.22 | 0.44 | 0.22 | 0.66 | 0.22 | 0.88 | 0.22 | 1.1 | single 0.22 | line = |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |

Figure 8:
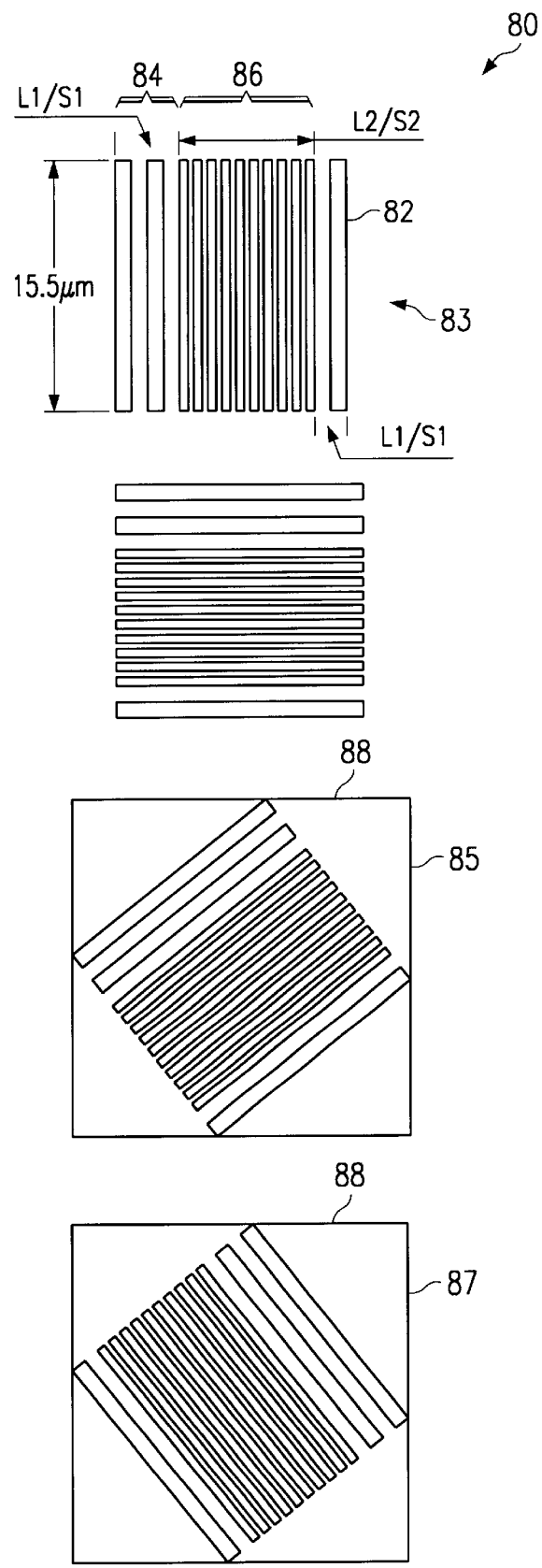

The image displacement mark 80 in FIG. 8 contains lines 82 which are subdivided into large width marks 84 and small width marks 86 and have a length of about 15.5 micrometers. Both the linewidth and the pitch size are variable in the line 32 that make up image displacement mark 80. Furthermore, the lines are rotated to a 90 degree, 45 degree, and 135 degree angle relative to the first mark. The marks 85 and 87 are both surrounded by a box 88. The linewidth and the pitch size are defined by dividing the different lines 82 from the ends as they approach the middle of the image displacement mark 80 by dividing the variable L1 by S1 as they approach the center in mark 83 from left to right.

Figure 9:
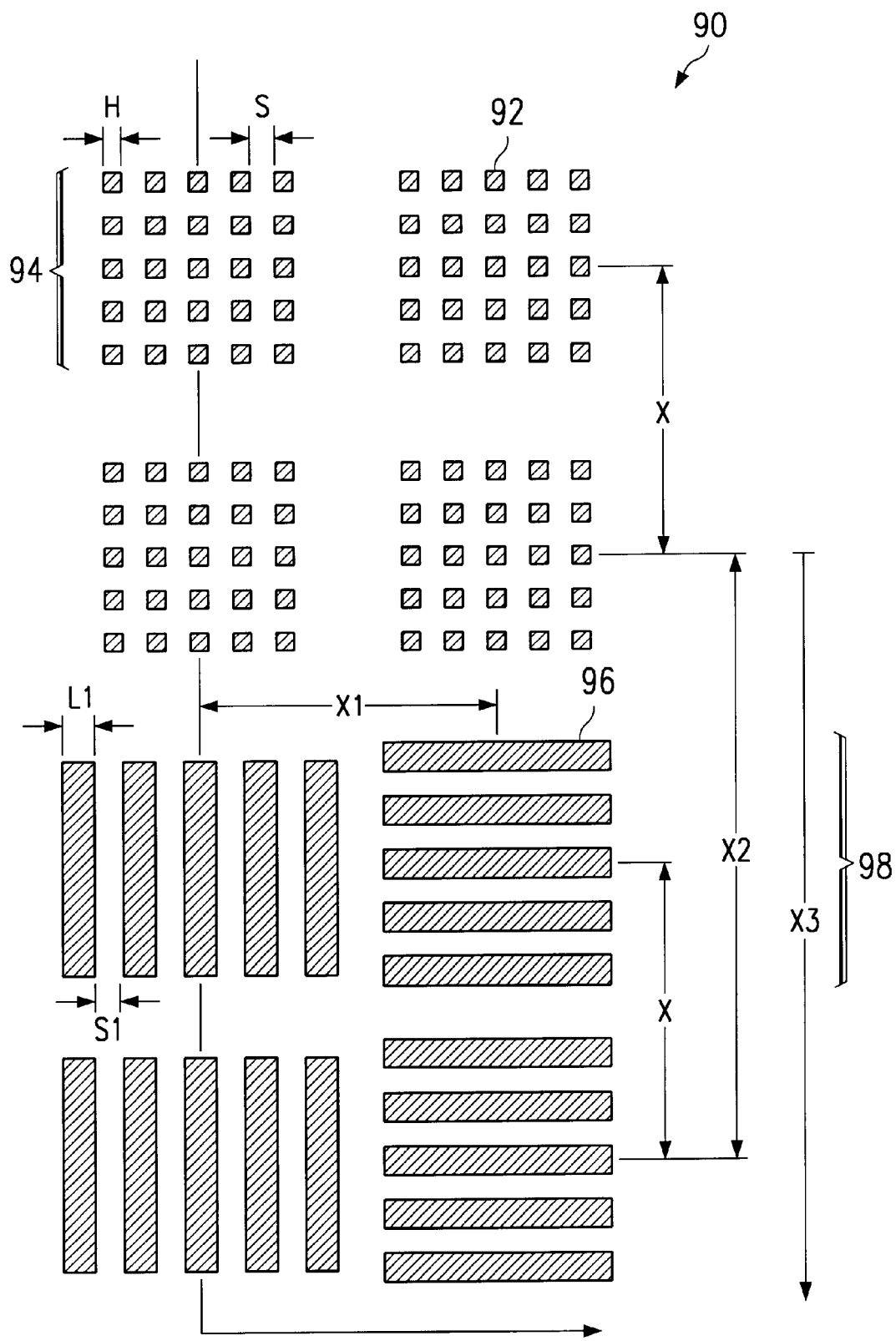

FIG. 9 shows an image displacement mark 90 with a five by five hole array having an overlay pattern display. A series of four five by five hole arrays 94 have a square hole 92 which has a width of H. The hole 92 may also be a hole of any shape. The distance between hole 92 is the distance S. The distance between the center points of the hole arrays 94 are the distance X and X1. Adjacent to the hole array 94 are lines 96 that form line pentads 98. The lines 96 have a width of L1 and are separated by a pitch size of S1. The distance between adjacent pentads 98 from center point to center point are the distances X and X1. The distance between hole array 94 and pentads 96 at the closest point are defined by the distance X2. The distance between adjacent image displacement mark is the distance X3. The fixed dimensions for image displacement mark 90 are X1 of about is 25 micrometers, X2 of about 50 micrometers, L1 of about 2 micrometers, and S1 of about 2 micrometers. The variable dimensions are defined for H and S in Table 5 hereinbelow. The linewidth and pitch sizes will vary on the device size of the underlying circuit, with smaller sizes for smaller device widths.

Figure 11:
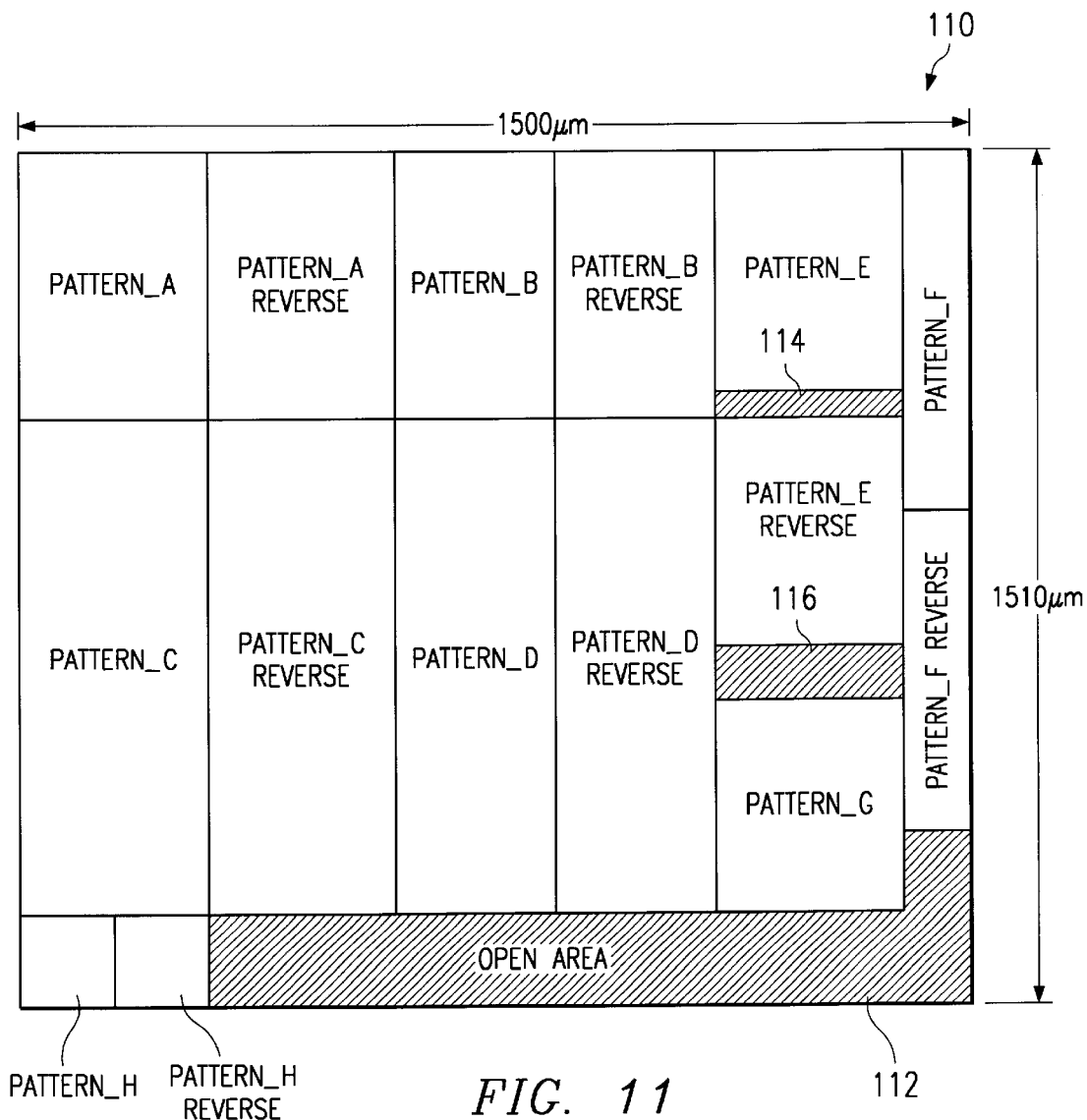
FIG. 11 is a composite image displacement mark of positive and negative forms of the image displacement mark disclosed herein.

10 in the patterns designated A through F in FIG. 11. Both the positive and negative forms of the image displacement marks 30, 40, 50, 60, 70, 80, 90, and 100 (in one example, respectively Pattern A through F) serve to better align the lens optics of, e.g., an optical stepper as one or the other form may be used depending on the preference of the user. The composite image displacement mark 110 may have a side length of about 1510 micrometers and has open areas 112 in which other patterns or image displacement marks

TABLE 5 unit: um

| H | S | H | S | H | S | H | S | H | S | H | S |
|---|---|---|---|---|---|---|---|---|---|---|---|
| 0.5 | 0.5 | 0.5 | 1 | 0.5 | 1.5 | 0.5 | 2 | 0.5 | 2.5 | single | line = 0.5 |
| 0.4 | 0.4 | 0.4 | 0.8 | 0.4 | 1.2 | 0.4 | 1.6 | 0.4 | 2 | single | line = 0.4 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.35 | 0.35 | 0.35 | 0.7 | 0.35 | 1.05 | 0.35 | 1.4 | 0.35 | 1.75 | single | line = 0.35 |
| 0.32 | 0.32 | 0.32 | 0.64 | 0.32 | 0.96 | 0.32 | 1.28 | 0.32 | 1.6 | single | line = 0.32 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.3 | 0.3 | 0.3 | 0.6 | 0.3 | 0.9 | 0.3 | 1.2 | 0.3 | 1.5 | single | Line = 0.3 |
| 0.28 | 0.28 | 0.28 | 0.56 | 0.28 | 0.84 | 0.28 | 1.12 | 0.28 | 1.4 | single | line = 0.28 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |
| 0.25 | 0.25 | 0.25 | 0.5 | 0.25 | 0.75 | 0.25 | 1 | 0.25 | 1.25 | single | line = 0.25 |
| 0.22 | 0.22 | 0.22 | 0.44 | 0.22 | 0.66 | 0.22 | 0.88 | 0.22 | 1.1 | single | line = 0.22 |
| 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 |

Figure 10:
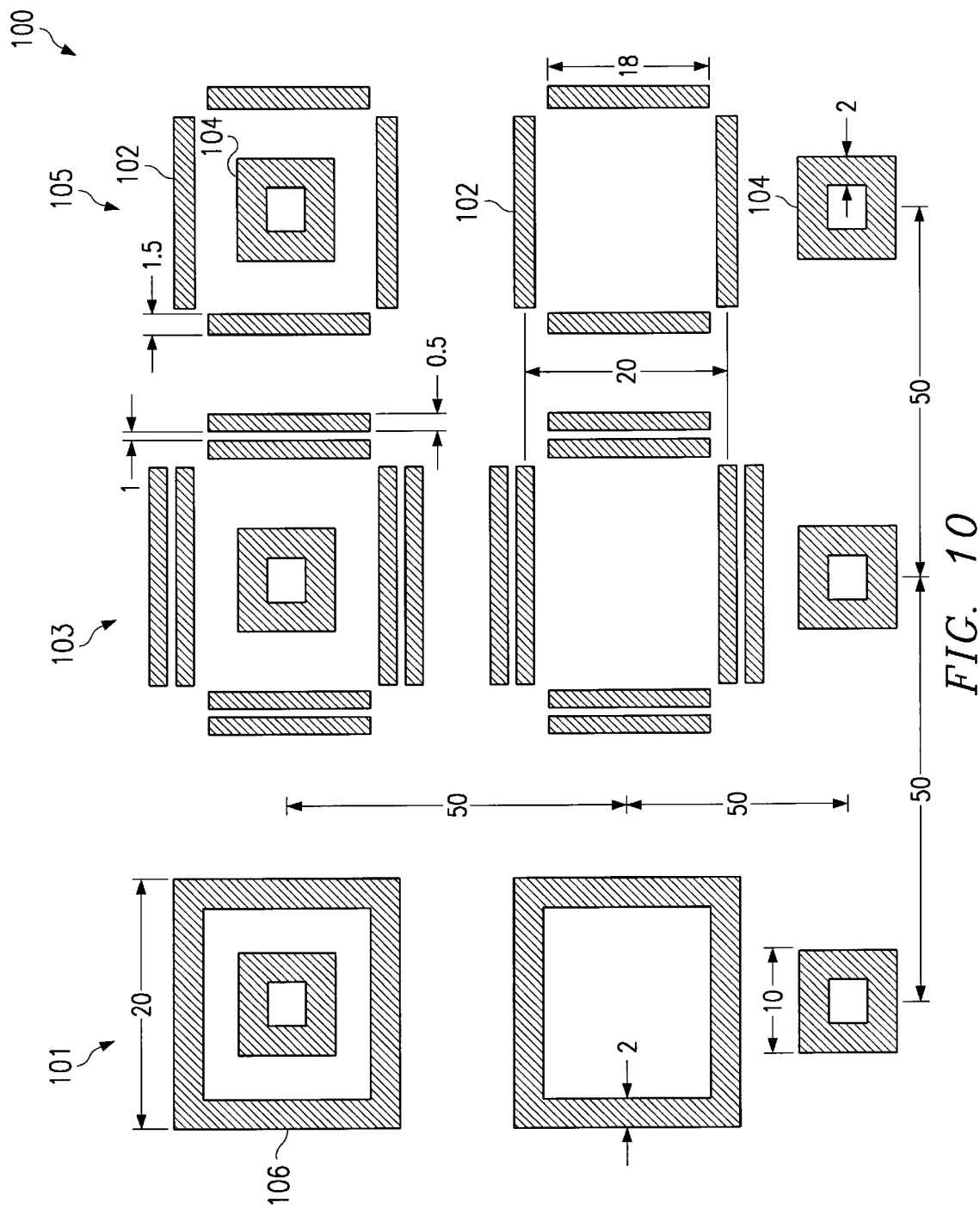

FIG. 10 is an image displacement mark 100 having adjacent box-in-box marks 101, storage note and storage note contact image displacement marks 103, and box-in-line marks 105. Lines 102 and boxes 104 are depicted in which the linewidth is varied between 0.5 micrometers and 2 micrometers. The length of the lines 102 is about 18 micrometers. The box-in-box marks 101 and the adjacent storage note/storage note contact image displacement marks 103 are of about 50 micrometers. The distance between storage note contact marks 103 and adjacent box-in-line mark 105 is also about 50 micrometers. The outer dimension of the box 104 is about 10 micrometers for the small box and about 20 micrometers for the large box 106. The linewidth of the large box 106 is about 2 micrometers, as is the linewidth of the small box 104.

FIG. 11 shows a composite image displacement mark 110. The composite image displacement mark 110 has both the positive and negative versions of image displacement marks 30, 40, 50, 60, 70, 80, 90, and 100 disposed therein. Using the composite image displacement mark 110 changes in illumination may be detected by focusing image displacement using the mark best capable of differentiating between image displacement during changes in illumination. As depicted herein, the composite image displacement mark 110 has both the positive and negative forms of the image displacement marks 30, 40, 50, 60, 70, 80, 90, and 100, which may be formed into an array such as that depicted as may be placed. The size of the pattern area will depend on the variable portions of those image displacement marks that are selected to form the composite image displacement mark 110.

One important feature of the present invention is that one layer image displacement marks that use variable linewidth and pitch size for the outer image displacement marks design may be used to keep the standard inner box as a measurement reference. Another important feature of one embodiment of the present invention is that two layer image displacement marks may use standard inner boxes as first print and variable linewidth and pitch outer image displacement marks as part of a second print. These features can make the image displacement test reticle have the following advantages. First, the one-layer image displacement marks may be used to measure displacement across the field without stepper image displacement system and process related errors. Second, two-layer image displacement marks may be used to simulate the image displacement process of actual devices and may also be used to obtain correct image displacement data for compensating actual device misalignment. Third, all of these marks may be used to run an image displacement analysis in conjunction with automated measurements. The measurement time of the automated image displacement is generally reduced as compared with manual critical dimension measurements.

The image displacement test reticle of the present invention may be used for the following applications. During mass production and manufacturing, the image displacement test reticle may be used to evaluated any common stepper image displacement performance. Based on acceptance test specifications and the data corrected using the test reticle disclosed herein, it may be decided whether to accept or reject the incoming stepper. The test reticle may also be used as a routine stepper qualification reticle for maintaining the stepper image displacement base. The image displacement test reticle may also be used by photolithography process engineers for image displacement process optimization, process troubleshooting, and process yield improvement.

Furthermore, equipment engineers may use the image displacement test reticle to adjust stepper image displacement base line when image displacement base line shift occurs. Also, stepper venders may use the image displacement test radical to inspect further lithographic stepper machines during the optical system assembly. The inspection results may be used to provide feedback to improve the design of the current and future systems. Finally, image displacement metrology tool vendors may use the image displacement test reticle to quantify measurement machine accuracy when handling smaller geometry and pitch size image displacement mark.

Four dies located at the center of wafer were measured using the illumination conditions. Twenty one measurement sites were selected for each die. All of the analysis data was based on the average measurement reading of four dies. Only a few cases are chosen to illustrate and explain the issues.

Figure 12:
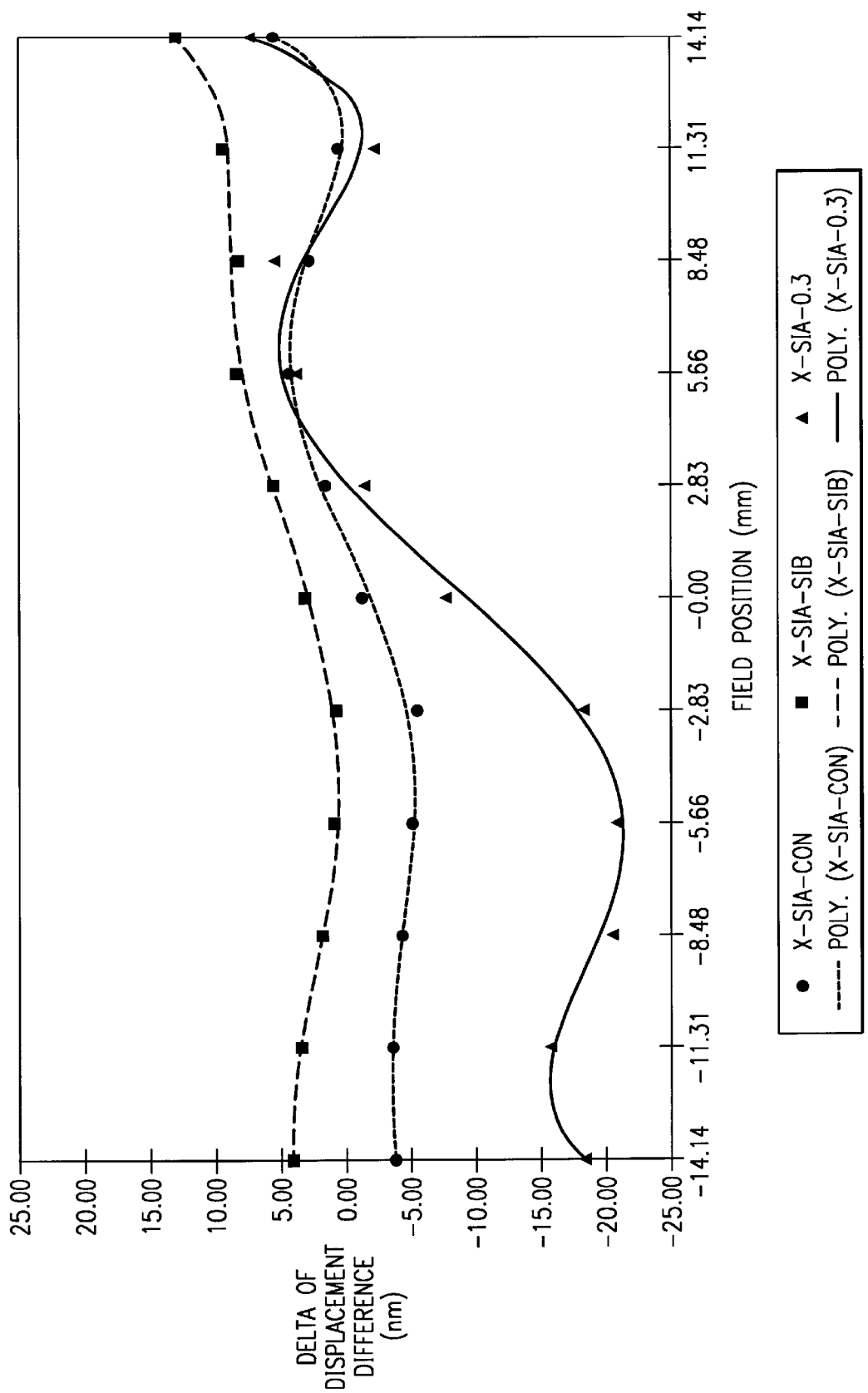
FIGS. 12 through 15 show graphs demonstrating the image displacement obtained using image displacement marks disclosed herein.
Figure 13:
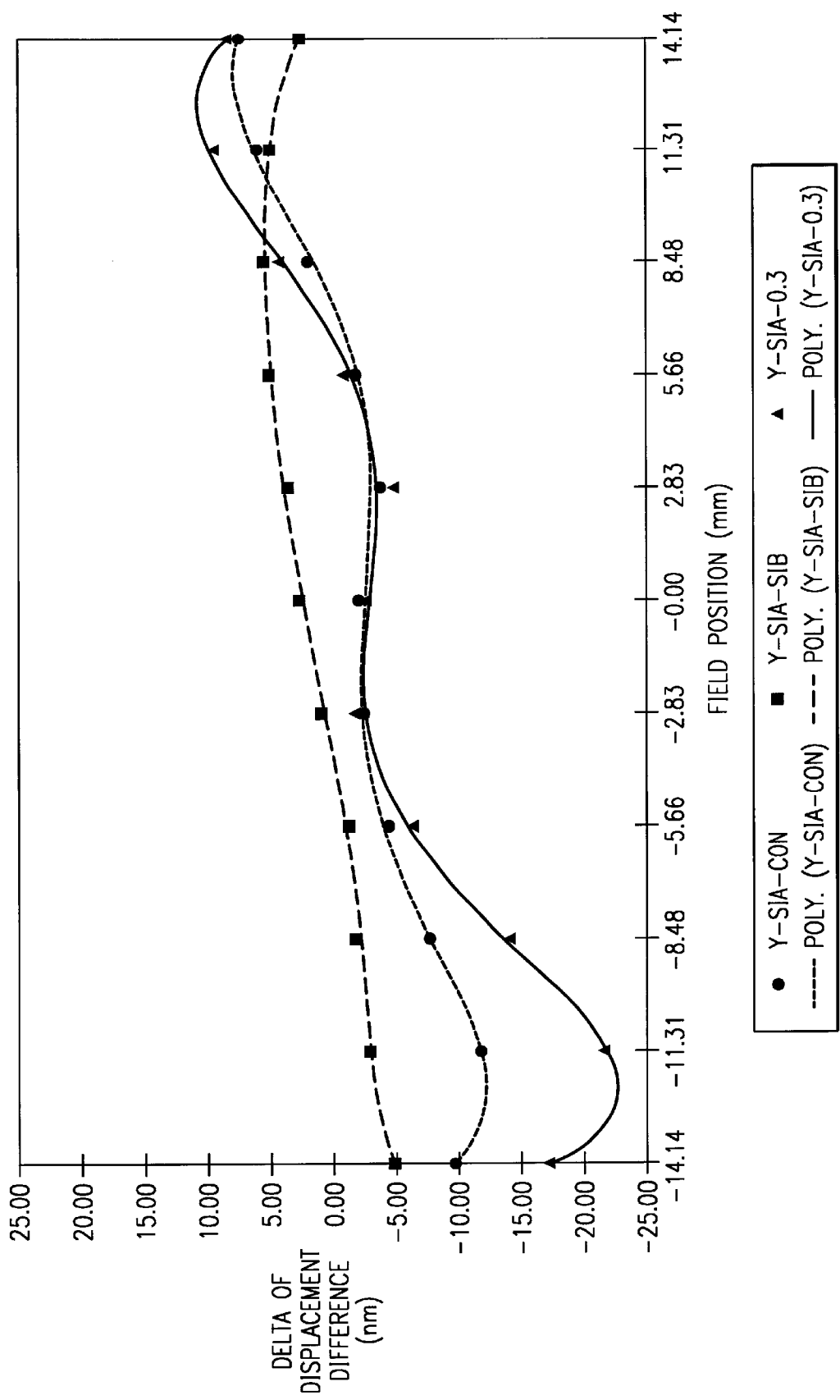

An illumination mismatching among different modes was observed. The displacement discrepancy between two different illumination modes is demonstrated in FIGS. 12 and 13 in the cases of equal line/space of 0.4 μm and isolated line of 0.5 μm, respectively. These results indicate that if the first print is conventional illumination with 0.3 sigma and the second print super illumination (SI) using an SIA stopper, the displacement discrepancy at same location caused by illumination mismatching may be greater than 20 μm at the worst location within the field. The possible root causes of this phenomenon are: the residual aberration values of different illumination modes are different and coma aberration should be mainly concerned; or changing the illumination apertures cause incomplete telecentricity. Also, the degree of incomplete telecentricity for each illumination mode is not same.

Figure 14:
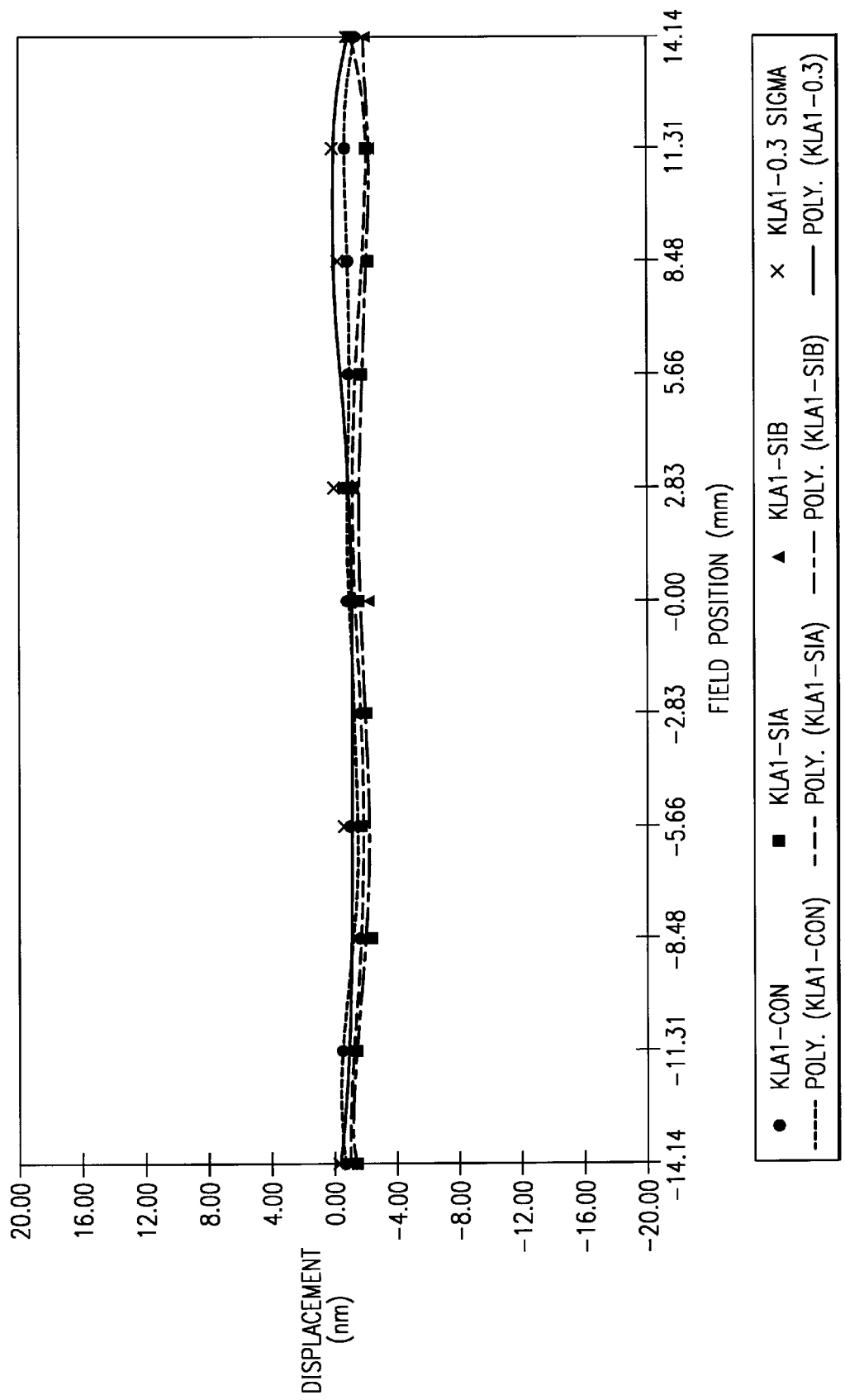
Figure 15:
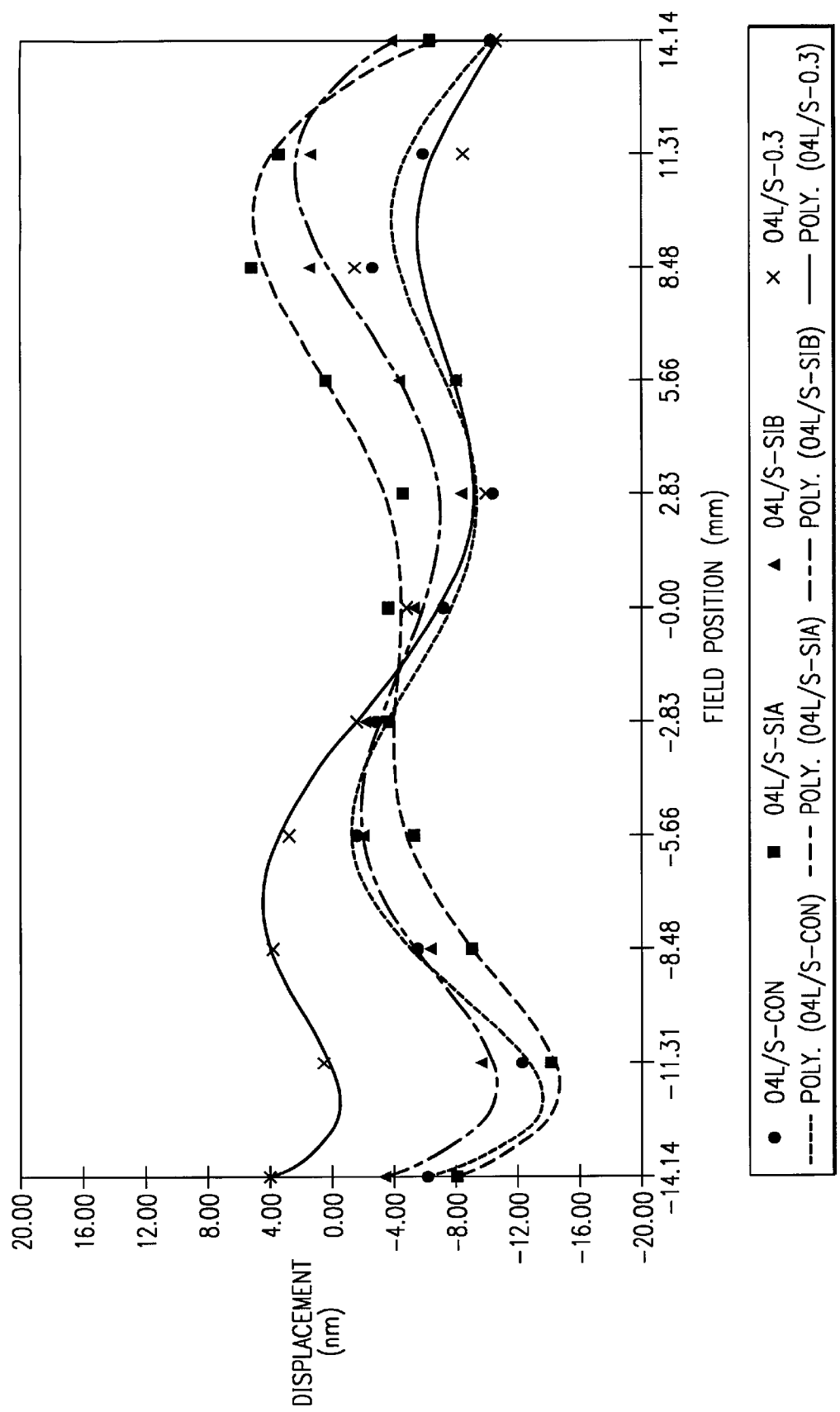

Intensity-unbalanced illumination is one of the reasons, particularly in the case of super illumination using an SIA stopper setting, for the errors observed. Furthermore, errors in telecentricity error may also cause the displacement. The image displacement displacement between standard KLA™ and smaller linewidth and pitch size marks, such as the standard KLA™ mark, is insensitive to the illumination condition change as shown in FIG. 14. The displacement discrepancy closes to zero under the four illumination conditions causing optical aberrations. For the outer mark with 0.4 equal line/space, however, the displacement values shifted under the four illumination conditions. FIG. 15 shows the displacement results of magnitude and direction.

The present results, obtained on a AE 104 stepper, show that the highest spatial frequency term (0.3 μm equal line/space) has the largest displacement value, and the lowest spatial frequency term (KLA™ 1 mark) shows the least displacement value which is less than 2 nm.

The small sigma illumination enhanced the displacement significantly when compared to the other three illumination modes. The trend of displacement with =0.3 shows significant shift across field variation. From a coma test, it was determined that a coma aberration on the AE 104 stepper increases when a decreases. The worst case is when is equal to 0.3.

The displacement across the field is not constant because the optical lens aberrations depend on field coordinates. Therefore, different field positions have different distorted wave front curvatures, in particular, when they form distorted images which are shifted to the position the ideal locations.

The illumination system of steppers is often designed as a Kohler illumination system. In the Kohler illumination system, the mask is placed on the exit pupil of a condenser lens. In a ideal case, the condenser lens provides uniform illumination on the mask from the source that is not uniform. In stepper systems, however, the illumination optics are not designed and manufactured as precisely as projection optics. The separate design and manufacture of image displacement systems caused condenser aberrations, misalignment of optical components, and a non-uniform effective source. The non-uniform effective source induces tilt of the illumination light on the mask because the angular distribution of the illumination on the mask is defined by the effective source distribution. Different illumination apertures have different non-uniform effective source values, which give different tilt effects. Normally, the tilt performance of, e.g., a Canon AE 104 stepper, may only be optimized to one illumination condition, but that is no guarantee for the other illumination modes. That is why the displacement results show the standard convention illumination has less tilt effect than other illumination modes.

The image displacement caused by different illumination conditions was measured on the newly designed image displacement test reticle with different linewidth and pitch sizes empirically. The empirical data show that displacement depends not only on the illumination conditions but also on the linewidth and pitch size of pattern feature. To better control the image displacement accuracy between two layers exposed under different illumination modes for 0.25–0.35 μm technology devices, it is important to conduct illumination matching and image displacement on the stepper equipment. These results reveal that standard image displacement mark having 10–20 μm box-in-box, which is conventionally used for overlay measurement in device fabrication, may not monitor the fine pattern displacement inside of the chip. Acceptance tests for incoming stepper should include fine pattern displacement checks under modified illumination conditions. The image displacement test reticle and patterns described herein, provide the inspection tools necessary to adjustment the optics of the stepper on site.

As smaller sigma illumination introduces higher lens aberrations, the stepper systems must be verified and modified for changing image displacement and illumination conditions. For example, the illuminator and projection system design specification to meet the challenge image displacement requirements and support the new technology in semiconductor industry.

Thus, the present inventors have recognized that a significant problem of current tools for image displacement testing will be that current image displacement marks having linewidths of 1 to 2 microns, and pitch sizes of 10 to 20 microns, such as the box in box pattern, will fail to monitor performance of advanced illumination techniques which will be used on integrated circuit device cells having, e.g. linewidths of 0.25 to 0.5 microns, and pitch sizes of 0.5 to 1 micron.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of measuring aberration of a projection lens in a photolithographic patterning system comprising the steps of:
    taking a first alignment measurement with a test reticle having a variable linewidth and a variable pitch size on an outer alignment mark;
    changing the illumination conditions of photolithographic equipment that projects light upon said test reticle; and
    taking a second alignment measurement with said test reticle having a variable linewidth and a variable pitch size on an outer alignment mark and comparing said second alignment measurement to said first alignment measurement to determine an alignment offset due to said change in illumination;
    wherein said test reticle comprises the alignment mark including four sets of five by five resin arrays adjacent to two sets of lines having a first pair aligned vertically and a second pair aligned horizontally, wherein the first and the second set of lines are placed adjacent to each other, each of first and second pair of lines facing opposite the other, each set of lines forms a pentad.

2. A method of measuring aberration of a projection lens in a photolithographic patterning system comprising the steps of:
    taking a first alignment measurement with a test reticle having a variable linewidth and a variable pitch size on an outer alignment mark;
    changing the illumination conditions of photolithographic equipment that projects light upon said test reticle; and
    taking a second alignment measurement with said test reticle having a variable linewidth and a variable pitch size on an outer alignment mark and comparing said second alignment measurement to said first alignment measurement to determine an alignment offset due to said change in illumination;
    wherein said test reticle comprises the alignment mark having adjacent box-in-box marks, storage note and storage note contact alignment marks.

3. A method of measuring aberration of a projection optics testing comprising the steps of:
    taking a first image displacement measurement with a test reticle having a variable linewidth and a variable pitch size on an outer image displacement mark and a standard inner box as a measurement reference;
    changing the illumination conditions of photolithographic equipment projected upon said test reticle;
    taking a second image displacement measurement and comparing said second image displacement measurement to said first image displacement measurement to determine an image displacement offset due to said change in illumination;
    adjusting a production reticle position to adjust for misalignment based on the image displacement offset;
    changing the illumination conditions of photolithographic equipment; and
    taking a third image displacement measurement to said comparing said third image displacement measurement to said first or said second image displacement measurement to determine an image displacement offset due to said change in illumination.

4. A method of measuring aberration of a projection optics testing comprising the steps of:
    taking a first image displacement measurement with a test reticle having a variable linewidth and a variable pitch size on an outer image displacement mark and a standard inner box as a measurement reference;
    changing the illumination conditions of photolithographic equipment projected upon said test reticle;
    taking a second image displacement measurement and comparing said second image displacement measurement to said first image displacement measurement to determine an image displacement offset due to said change in illumination;
    adjusting a production reticle position to adjust for misalignment based on the image displacement offset;
    wherein said test reticle further comprises a standard inner box located within said outer image displacement mark.

5. A method of measuring aberration of a projection lens in a photolithographic patterning system comprising the steps of:
    taking a first image displacement measurement with a test reticle having a variable linewidth and a variable pitch size on an outer image displacement mark;
    changing the illumination conditions of photolithographic equipment that projects light upon said test reticle; and
    taking a second image displacement measurement with said test reticle having a variable linewidth and a variable pitch size on an outer image displacement mark and comparing said second image displacement measurement to said first image displacement measurement to determine an image displacement offset due to said change in illumination;
    wherein said test reticle comprises the image displacement mark having four sets of lines that surround a box such that each set of lines forms a triad, each set placed adjacent to one side of said box;
    wherein each set of lines having a constant linewidth, a length, and separated by a constant pitch size, the center of each triad separated by a predetermined distance.

6. The method of claim 5, wherein the length equals about 14 $\mu$m, the predetermined distance equals approximately 25 $\mu$m, 0.2 $\mu$m $\leq$ linewidth $\leq$ 1, and 0.2 $\mu$m $\leq$ pitch size $\leq$ 1.

7. A method of measuring aberration of a projection lens in a photolithographic patterning system comprising the steps of:
    taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines that surround a box such that each set of lines forms a triad, each set placed adjacent to one side of said box;

wherein said box has an outer length dimension, said box comprises a line of a predetermined thickness.

8. The method of claim 7, wherein the outer length dimension equals about 10 $\mu$m, and the predetermined thickness equals about 2 $\mu$m.

9. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines that surround a box such that each set of lines forms a pentad, each set placed adjacent to one side of said box;

wherein each set of lines having a constant linewidth, a length, and separated by a constant pitch size, the center of each triad separated by a predetermined distance.

10. The method of claim 9, wherein the length equals about 14 $\mu$m, the predetermined distance equals approximately 25 $\mu$m, 0.2 $\mu$m$\geq$linewidth$\leq$1, and 0.2 $\mu$m$\geq$pitch size$\leq$1.

11. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines that surround a box such that each set of lines forms a pentad, each set placed adjacent to one side of said box;

wherein said box has an outer length dimension, said box comprises a line of a predetermined thickness.

12. The method of claim 11, wherein the outer length dimension equals about 10 $\mu$m, and predetermined thickness equals about 2 $\mu$m.

13. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines having a first pair aligned vertically and a second pair aligned horizontally, each pair facing opposite the other, a box positioned adjacent to one set of lines, each set of lines forms a triad;

wherein each set of lines having a constant linewidth, a length, and separated by a constant pitch size, the center of each triad separated by a predetermined distance.

14. The method of claim 13, wherein the length equals about 14 $\mu$m, the predetermined distance equals approximately 25 $\mu$m, 0.2 $\mu$m$\geq$linewidth$\leq$1, and 0.2 $\mu$m$\geq$pitch size$\leq$1.

15. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines having a first pair aligned vertically and a second pair aligned horizontally, each pair facing opposite the other, a box positioned adjacent to one set of lines, each set of lines forms a triad;

wherein said box has an outer length dimension, said box comprises a line of a predetermined thickness.

16. The method of claim 15, wherein the outer length dimension equals about 10 $\mu$m, and predetermined thickness equals about 2 $\mu$m.

17. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines having a first pair aligned vertically and a second pair aligned horizontally, each pair facing opposite the other such that rectangular area is formed, a box positioned adjacent to one set of lines, each set of lines forms a pentad;

wherein each set of lines having a constant linewidth, a length, and separated by a constant pitch size, the center of each triad separated by a predetermined distance.

18. The method of claim 17, wherein the length equals about 14 $\mu$m, the predetermined distance equals approximately 25 $\mu$m, 0.2 $\mu$m$\leq$linewidth$\leq$1, and 0.2 $\mu$m$\geq$pitch size$\leq$1.

19. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having four sets of lines having a first pair aligned vertically and a second pair aligned horizontally, each pair facing opposite the other such that rectangular area is formed, a box positioned adjacent to one set of lines, each set of lines forms a pentad;

wherein said box has an outer length dimension, said box comprises a line of a predetermined thickness.

20. The method of claim 19, wherein the outer length dimension equals about 10 $\mu$m, and predetermined thickness equals about 2 $\mu$m.

21. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having eight sets of lines having a first pair aligned vertically and a second pair aligned horizontally, each of first and second pair facing opposite the other, said set having a third and fourth pair of lines, the third pair aligned vertically and the fourth pair aligned horizontally, each set of lines forms a pentad;

wherein first and second pair of lines each having a first constant linewidth, a first length, and separated by a first constant pitch size, the center of each pentad separated a first predetermined distance.

22. The method of claim 21, wherein the first length equals about 10 $\mu$m, the first predetermined distance equals approximately 25 $\mu$m, the first constant linewidth equals about 2 $\mu$m, and the first pitch size equals about 2 $\mu$m.

23. The method of claim 21, wherein the third and fourth pair of lines having a second constant linewidth, a second length, and separated by a second constant pitch size, the center of each pentad separated a second predetermined distance, wherein the second constant linewidth is greater than the first constant linewidth.

24. The method of claim 23, wherein the second predetermined distance equals about 25 $\mu$m, the second predetermined distance equals about 4 $\mu$m, and the second constant linewidth equals about 4 $\mu$m.

25. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark having two sets of lines, the first set having a first width, the second set of lines having a second width, wherein the first width is greater than the second width, each set placed adjacent to one another;

wherein both sets of lines having a constant length, said first set having a first linewidth each line in said first set separated by a first constant pitch size, said second set having a second linewidth, each line in said second set separated by a second constant pitch size, wherein the first linewidth is greater than the second linewidth and the first constant pitch size is greater than the second constant pitch size.

26. The method of claim 25, wherein the first constant length equals about 15.5 $\mu$m.

27. The method of claim 25, further comprising a second image displacement mark rotated 90 degrees relative to the first image displacement mark, the second image displacement mark having two sets of lines having large width marks and small width marks respectively, each set placed adjacent to one another.

28. The method of claim 27, further comprising a third image displacement mark rotated 45 degrees relative to the first image displacement mark, said third image displacement mark having two sets of lines, said first set having a first width, said second set having a second width, wherein the first width is greater than the second width, each set placed adjacent to one another.

29. The method of claim 28, further comprising a fourth image displacement mark rotated 135 degrees relative to the first image displacement mark, the fourth image displacement mark having two sets of lines, said first set having a first width, said second set having a second width, wherein the first width is greater than the second width, each set placed adjacent to one another.

30. A method of measuring aberration of a projection lens in a photolithographic patterning system comprising the steps of:

taking a first image displacement measurement with a test reticle having a variable linewidth and a variable pitch size on an outer image displacement mark;

changing the illumination conditions of photolithographic equipment that projects light upon said test reticle; and taking a second image displacement measurement with said test reticle having a variable linewidth and a variable pitch size on an outer image displacement mark and comparing said second image displacement measurement to said first image displacement measurement to determine an image displacement offset due to said change in illumination;

wherein said test reticle comprises the image displacement mark including four sets of five by five resin arrays adjacent to two sets of lines having a first pair aligned vertically and a second pair aligned horizontally, wherein the first and the second set of lines are placed adjacent to each other each of first and second pair of lines facing opposite the other, each set of lines forms a pentad;

wherein first and second pair of lines having a constant linewidth, a length, and are separated by a constant pitch size, the center of each pentad separated a first predetermined distance, the center of each five by five resin arrays separated a second predetermined distance, each resin having a third predetermined distance between each, each resin having a width.

31. The method of claim 30, wherein the first predetermined distance equals about 25 $\mu$m, the length equals approximately 50 $\mu$m, the constant linewidth equals about 2 $\mu$m, and the pitch size equals about 2 $\mu$m.

32. The method of claim 30, wherein 0.2 $\mu$m$\leq$pitch size$\leq$0.5 $\mu$m, 0.2 $\mu$m$\leq$width$\leq$0.5 $\mu$m.

* * * * *